(12) United States Patent
Lin et al.

(10) Patent No.: US 9,960,296 B2
(45) Date of Patent: May 1, 2018

(54) SOLAR ENERGY COLLECTING MODULE

(75) Inventors: Hui-Hsiung Lin, Hsinchu County (TW); Chia-Wei Yu, Yilan County (TW); Yu-Nan Pao, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 1290 days.

(21) Appl. No.: 12/400,587

(22) Filed: Mar. 9, 2009

(65) Prior Publication Data
US 2010/0108056 A1    May 6, 2010

(30) Foreign Application Priority Data
Nov. 6, 2008  (TW) ................................ 97142819 A (51) Int. Cl.
*F24J 2/10* (2006.01)
*H01L 31/0236* (2006.01)
(Continued)

(52) U.S. Cl.
CPC .... *H01L 31/02366* (2013.01); *H01L 31/0547* (2014.12); *F24J 2/067* (2013.01); *Y02E 10/52* (2013.01)

(58) Field of Classification Search
CPC ........ G02F 1/01; G02F 1/01708; G02F 1/011; G02F 1/025; G02B 6/0229; F21V 7/00; F24J 2002/1061; F24J 2/10; F24J 2002/1066; F24J 2002/1085; F24J 2002/109; F24J 2/1057; F24J 2/18; F24J 2/067; H01L 31/0525; H01L 31/0522; H01L 31/02366; H01L 31/0547; Y02E 10/52

USPC ........ 126/569, 593, 600, 674–676, 683–685, 126/696; 250/200; 359/298, 315, 359/317–319; 385/8, 129–131; 136/243–265
See application file for complete search history.

(56) References Cited

U.S. PATENT DOCUMENTS 2,677,714 A *  5/1954  Max ............................. 136/256
3,247,392 A *  4/1966  Thelen ......................... 250/226
(Continued)

FOREIGN PATENT DOCUMENTS

CN  1447134 A     10/2003
EP  1988332 A1 *  11/2008
(Continued)

OTHER PUBLICATIONS

Taiwan Patent Office, Office Action, Patent Application Serial No. 97142819, dated Jun. 21, 2012, Taiwan.
(Continued)

*Primary Examiner* — Eric Stapleton (57) ABSTRACT

A solar energy collecting system includes a substrate and at least one solar chip. The substrate includes a first surface, a second surface and a plurality of lateral surfaces, wherein the first surface faces the second surface, the lateral surfaces are adjacent to the first and second surfaces, and a first micro structure is formed on the first or the second surface. The solar chip is near one of the lateral surfaces. Solar light penetrates the first and the second surface and is refracted or reflected by the first micro structure to leave the substrate via the lateral surface and be absorbed by the solar chip.

9 Claims, 6 Drawing Sheets

(51) Int. Cl.
*H01L 31/054* (2014.01)
*F24J 2/06* (2006.01)

(56) References Cited

U.S. PATENT DOCUMENTS

| | | | |
|---|---|---|---|
| 3,597,281 A * | 8/1971 | Webb | 36/245 |
| 4,116,718 A * | 9/1978 | Yerkes et al. | 136/246 |
| 4,154,219 A * | 5/1979 | Gupta et al. | 126/575 |
| 4,200,472 A * | 4/1980 | Chappell et al. | 136/246 |
| 4,245,619 A * | 1/1981 | Ogilvie | 126/668 |
| 4,282,856 A * | 8/1981 | Stehl et al. | 126/706 |
| 4,282,862 A * | 8/1981 | Soleau | 126/687 |
| 4,344,417 A * | 8/1982 | Malecek | 126/687 |
| 4,357,486 A * | 11/1982 | Blieden et al. | 136/247 |
| 4,396,643 A * | 8/1983 | Kuehn et al. | 427/160 |
| 4,400,577 A * | 8/1983 | Spear | 136/259 |
| 4,497,974 A * | 2/1985 | Deckman et al. | 136/259 |
| 4,633,031 A * | 12/1986 | Todorof | 136/249 |
| 4,688,068 A * | 8/1987 | Chaffin et al. | 136/249 |
| 4,863,224 A * | 9/1989 | Afian et al. | 359/15 |
| 5,110,370 A * | 5/1992 | Vogeli et al. | 136/246 |
| 5,123,247 A * | 6/1992 | Nelson | 60/641.8 |
| 5,261,970 A * | 11/1993 | Landis et al. | 136/259 |
| 5,356,488 A * | 10/1994 | Hezel | 136/256 |
| 5,482,568 A * | 1/1996 | Hockaday | 136/246 |
| 5,578,140 A * | 11/1996 | Yogev et al. | 136/246 |
| 5,666,127 A * | 9/1997 | Kochiyama et al. | 343/853 |
| 5,720,827 A * | 2/1998 | Simmons | 136/250 |
| 5,726,805 A * | 3/1998 | Kaushik et al. | 359/589 |
| 5,782,993 A * | 7/1998 | Ponewash | 136/251 |
| 5,782,995 A * | 7/1998 | Nanya et al. | 136/257 |
| 5,877,874 A * | 3/1999 | Rosenberg | 359/15 |
| 5,886,688 A * | 3/1999 | Fifield et al. | 345/206 |
| 5,961,198 A * | 10/1999 | Hira et al. | 362/621 |
| 6,005,185 A * | 12/1999 | Tange | 136/259 |
| 6,008,449 A * | 12/1999 | Cole | 136/246 |
| 6,021,007 A * | 2/2000 | Murtha | 359/834 |
| 6,031,179 A * | 2/2000 | O'Neill | 136/246 |
| 6,040,937 A * | 3/2000 | Miles | 359/291 |
| 6,111,189 A * | 8/2000 | Garvison et al. | 136/244 |
| 6,123,431 A * | 9/2000 | Teragaki et al. | 362/625 |
| 6,198,037 B1 * | 3/2001 | Nakata | 136/246 |
| 6,207,890 B1 * | 3/2001 | Nakai et al. | 136/246 |
| 6,294,723 B2 * | 9/2001 | Uematsu et al. | 136/246 |
| 6,300,558 B1 * | 10/2001 | Takamoto et al. | 136/262 |
| 6,323,415 B1 * | 11/2001 | Uematsu et al. | 136/246 |
| 6,323,892 B1 * | 11/2001 | Mihara | 348/14.01 |
| 6,323,923 B1 * | 11/2001 | Hoshino et al. | 349/113 |
| 6,380,479 B2 * | 4/2002 | Nakai et al. | 136/246 |
| 6,465,724 B1 * | 10/2002 | Garvison et al. | 136/244 |
| 6,518,944 B1 * | 2/2003 | Doane et al. | 345/87 |
| 6,549,709 B1 * | 4/2003 | De Dobbelaere et al. | 385/49 |
| 6,580,496 B2 * | 6/2003 | Bamji et al. | 356/5.1 |
| 6,619,282 B1 * | 9/2003 | Murtha | 126/636 |
| 6,674,562 B1 * | 1/2004 | Miles | 359/291 |
| 6,822,157 B2 * | 11/2004 | Fujioka | 136/251 |
| 6,891,869 B2 * | 5/2005 | Augusto | 372/43.01 |
| 6,951,689 B1 * | 10/2005 | Higashikawa | 428/694 |
| 6,971,756 B2 * | 12/2005 | Vasylyev et al. | 359/852 |
| 7,123,216 B1 * | 10/2006 | Miles | 345/54 |
| 7,190,531 B2 * | 3/2007 | Dyson et al. | 359/742 |
| 7,301,095 B2 * | 11/2007 | Murphy et al. | 136/256 |
| 7,327,510 B2 * | 2/2008 | Cummings et al. | 359/291 |
| 7,557,935 B2 * | 7/2009 | Baruch | 356/614 |
| 7,595,543 B2 * | 9/2009 | Weber et al. | 257/622 |
| 7,701,029 B2 * | 4/2010 | Mabuchi | 257/462 |
| 7,741,144 B2 * | 6/2010 | Choi et al. | 438/57 |
| 7,750,425 B2 * | 7/2010 | Forrest et al. | 257/441 |
| 7,750,886 B2 * | 7/2010 | Sampsell | 345/102 |
| 7,804,023 B2 * | 9/2010 | Wong et al. | 136/256 |
| 2001/0006066 A1 * | 7/2001 | Cherney et al. | 126/698 |
| 2002/0050286 A1 * | 5/2002 | Kubota | 136/244 |
| 2003/0026536 A1 * | 2/2003 | Ho | 385/33 |
| 2003/0128538 A1 * | 7/2003 | Shinohara et al. | 362/31 |
| 2003/0213514 A1 * | 11/2003 | Ortabasi | 136/246 |
| 2004/0075464 A1 * | 4/2004 | Samuelson et al. | 326/37 |
| 2004/0247236 A1 * | 12/2004 | Yoshimura et al. | 385/16 |
| 2005/0030732 A1 * | 2/2005 | Kimura et al. | 362/31 |
| 2005/0117190 A1 * | 6/2005 | Iwauchi et al. | 359/237 |
| 2005/0133761 A1 * | 6/2005 | Thielemans | 252/299.61 |
| 2005/0225686 A1 * | 10/2005 | Brummack et al. | 349/1 |
| 2006/0002655 A1 * | 1/2006 | Smits | 385/31 |
| 2006/0066541 A1 * | 3/2006 | Gaily et al. | 345/84 |
| 2006/0077617 A1 * | 4/2006 | Floyd | 361/278 |
| 2006/0130889 A1 * | 6/2006 | Li et al. | 136/244 |
| 2006/0201546 A1 * | 9/2006 | Yokoyama | 136/263 |
| 2006/0262562 A1 * | 11/2006 | Fukasawa et al. | 362/615 |
| 2006/0275595 A1 * | 12/2006 | Thies et al. | 428/312.2 |
| 2007/0113887 A1 * | 5/2007 | Laih et al. | 136/259 |
| 2007/0125415 A1 * | 6/2007 | Sachs | 136/205 |
| 2007/0133935 A1 * | 6/2007 | Fine | 385/131 |
| 2007/0171330 A1 * | 7/2007 | Hung et al. | 349/65 |
| 2007/0171418 A1 * | 7/2007 | Nyhart, Jr. | 356/364 |
| 2007/0175510 A1 * | 8/2007 | Morooka et al. | 136/263 |
| 2007/0196040 A1 * | 8/2007 | Wang et al. | 385/1 |
| 2007/0227582 A1 * | 10/2007 | Chen et al. | 136/246 |
| 2007/0235072 A1 * | 10/2007 | Bermel et al. | 136/252 |
| 2007/0254208 A1 * | 11/2007 | Kurt et al. | 429/126 |
| 2007/0267055 A1 * | 11/2007 | Gaudiana et al. | 136/244 |
| 2007/0279727 A1 * | 12/2007 | Gandhi et al. | 359/242 |
| 2007/0279935 A1 * | 12/2007 | Gardiner et al. | 362/610 |
| 2008/0030650 A1 * | 2/2008 | Kitagawa et al. | 349/65 |
| 2008/0048102 A1 * | 2/2008 | Kurtz et al. | 250/226 |
| 2008/0105298 A1 * | 5/2008 | Lu et al. | 136/256 |
| 2008/0208517 A1 * | 8/2008 | Shamaie | 702/142 |
| 2008/0308151 A1 * | 12/2008 | Den Boer et al. | 136/256 |
| 2009/0078316 A1 * | 3/2009 | Khazeni et al. | 136/257 |
| 2009/0084438 A1 * | 4/2009 | den Boer et al. | 136/256 |
| 2009/0101192 A1 * | 4/2009 | Kothari et al. | 136/246 |
| 2009/0101193 A1 * | 4/2009 | Hsiao | 136/246 |
| 2009/0103161 A1 * | 4/2009 | Kothari et al. | 359/245 |
| 2009/0103165 A1 * | 4/2009 | Kothari et al. | 359/290 |
| 2009/0114265 A1 * | 5/2009 | Milbourne et al. | 136/246 |
| 2009/0126792 A1 * | 5/2009 | Gruhlke et al. | 136/259 |
| 2009/0231877 A1 * | 9/2009 | Mienko et al. | 362/552 |
| 2009/0283144 A1 * | 11/2009 | Hebrink et al. | 136/259 |
| 2009/0320809 A1 * | 12/2009 | Schiavoni et al. | 136/246 |
| 2010/0108133 A1 * | 5/2010 | Bhagavatula et al. | 136/256 |
| 2010/0236624 A1 * | 9/2010 | Khazeni et al. | 136/256 |
| 2010/0281721 A1 * | 11/2010 | Chen et al. | 40/541 |
| 2010/0282296 A1 * | 11/2010 | Chen et al. | 136/246 |
| 2010/0284055 A1 * | 11/2010 | Kothari et al. | 359/291 |

FOREIGN PATENT DOCUMENTS

| | | | | |
|---|---|---|---|---|
| EP | 2061092 A1 * | 5/2009 | | H01L 31/052 |
| EP | 2061093 A1 * | 5/2009 | | |
| WO | WO 2004114418 A1 * | 12/2004 | | H01L 31/04 |
| WO | WO 2007034397 A2 * | 3/2007 | | |
| WO | WO 2008/125471 A1 | 10/2008 | | |
| WO | WO 2008137299 A1 * | 11/2008 | | |
| WO | WO 2009064701 A1 * | 5/2009 | | |
| WO | WO 2009102670 A1 * | 8/2009 | | |

OTHER PUBLICATIONS

China Patent Office, Office Action, Patent Application Serial No. 200810177688.5, dated Feb. 24, 2011, China.

* cited by examiner

SOLAR ENERGY COLLECTING MODULE

CROSS REFERENCE TO RELATED APPLICATIONS

This Application claims priority of Taiwan Patent Application No. 97142819, filed on Nov. 6, 2008, the entirety of which is incorporated by reference herein.

BACKGROUND OF THE INVENTION

Field of the Invention

The invention relates to a solar energy collecting module, and in particular relates to a solar energy collecting module with a micro-structure refracting or reflecting solar light to a specific position for concentration.

Description of the Related Art

Due to rising petroleum prices and decreasing raw material supplies, new energy sources have been developed. Of which, solar energy has become a popular choice.

U.S. Pat. No. 7,190,531 discloses a solar energy collecting system utilizing a Fresnel lens to gather the solar light to a solar cell. Such a solar energy collecting system is often equipped with a solar tracking system that directs the solar cell to always face the sun, thereby increasing solar energy collection efficiency. However, such a system is very heavy and has limited applications.

U.S. Pat. No. 6,971,756 discloses a radiation energy collecting and transferring device utilizing mirrors to collect solar light. When the solar light reaches the mirrors, it is reflected to the solar cell. The mirrors change inclined angles to track the sun. Such a system, however, still requires a solar tracking system, which makes the system very heavy.

U.S. Pat. No. 6,619,282 discloses a solar energy collecting system utilizing water to conduct solar light and constrain the angle of the solar light. The solar light is conducted to the lateral side of the device. Although such a device occupies a smaller volume, water is needed.

BRIEF SUMMARY OF INVENTION

An embodiment of a solar energy collecting system of the invention comprises a substrate and at least one solar cell. The substrate comprises a first surface, a second surface and a plurality of lateral surfaces, wherein the first surface faces the second surface, the lateral surfaces are adjacent to the first and second surfaces, and a first micro-structure is formed on the first or the second surface. The solar cell is near one of the lateral surfaces. Solar light penetrates the first and the second surface and is refracted or reflected by the first micro-structure to leave the substrate via the lateral surface and be absorbed by the solar cell.

The first micro-structure comprises a plurality of strips parallel to one of the lateral surfaces, and the cross section of the strip is triangular.

The first micro-structure comprises protrusions of a pyramid or cylinder shape.

The solar cell is made of silicon or the chemical elements listed on the III or V column of the periodic table.

The first surface is coated by a water repellent material comprising polyvinylidene fluoride, polysulfone, reactive modifying agent with a water-free polymer, silicon rubber, Acrylonitrile-Butadien-Styrene, or PTFE.

The first surface has a micro/nano-scale structure comprising a micro/nano layer formed on the substrate. The micro/nano-scale structure comprises a plurality three-dimensional structures with a cross section having a width that is gradually large from a top to bottom portion, wherein the three dimensional structure has a period of 100~600 nm and a height of 100~570 nm.

A detailed description is given in the following embodiments with reference to the accompanying drawings.

BRIEF DESCRIPTION OF DRAWINGS

The present invention can be more fully understood by reading the subsequent detailed description and examples with references made to the accompanying drawings, wherein.

DETAILED DESCRIPTION OF INVENTION

Figure 1:
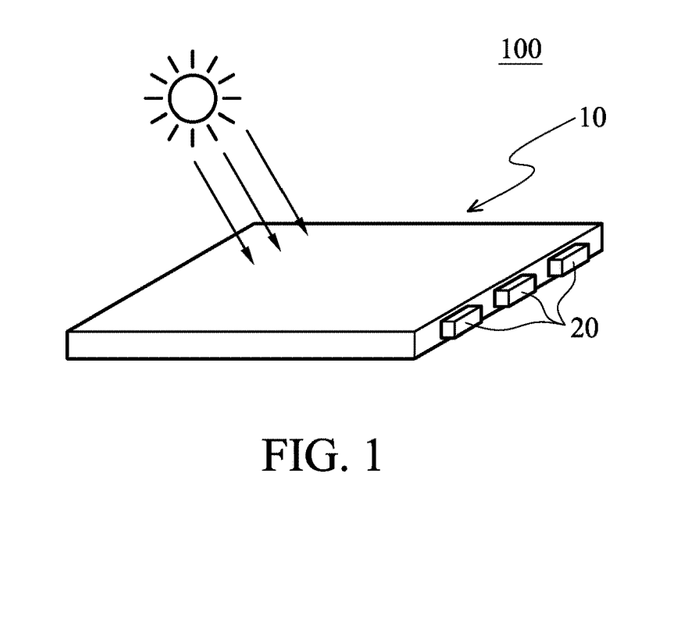
FIG. 1 is a schematic view of a solar energy collecting module of the invention.
Figure 2:
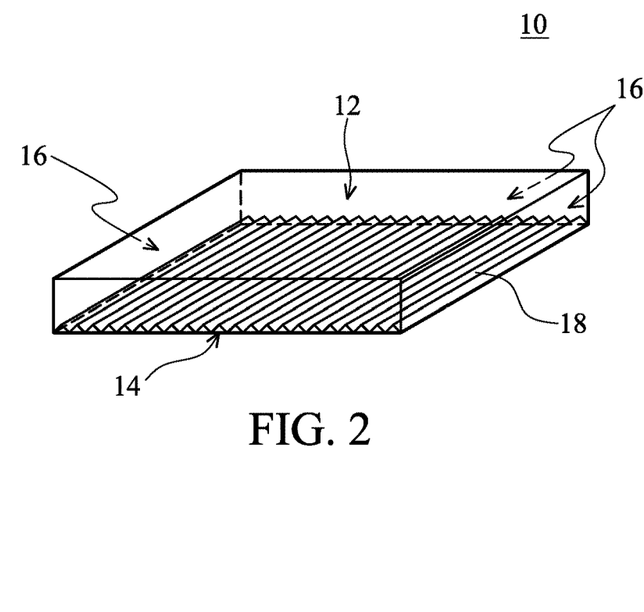
FIG. 2 is a schematic view showing a substrate of the solar energy collecting module in accordance with one embodiment of the invention.

Referring to FIG. 1, a solar energy collecting system 100 comprises a substrate 10 and at least one solar cell 20. FIG. 2 depicts the substrate 10. The substrate 10 comprises a first surface 12, a second surface 14 and four lateral surfaces 16. The first surface 12 faces the second surface 14. The lateral surfaces 16 are adjacent to the first surface 12 and the second surface 14. The solar cell 20 is near one of the four lateral surface 16, as shown in FIG. 1.

The substrate 10 is made of a transparent material, whereby the solar light penetrates the first surface 12 and reaches the second surface 14, as shown in FIG. 2. A microstructure 18 is formed on the second surface 14. The solar light is reflected or refracted by the micro-structure 18 to leave the substrate 10 and be absorbed by the solar cell 20. Although the micro-structure 18 is formed on the second surface 14 in this embodiment, the micro-structure 18 can be formed on the first surface 12.

To increase the amount of solar light entering the substrate 10, a micro/nano scale structure with anti-reflective function can be formed on the first surface. In addition, as the substrate 10 can be applied to the window glass, a micro/nano scale structure with water repellent property can be formed on the first surface 12 or a water repellent material can be coated on the first surface 12 to prevent rain drops from attaching to the window glass. The water repellent material can be polyvinylidene fluoride, polysulfone, reactive modifying agent with a water-free polymer, silicon rubber, Acrylonitrile-Butadien-Styrene, or Polytetrafluoroethylene (PTFE).

The micro-structure 18 on the second surface 14 comprises a plurality of strips, as shown in FIG. 2. The cross section of the strip is triangular. A part of the solar light can be reflected to leave the substrate 10 via the lateral surface 16 and enter the solar cell 20. In such a structure, the solar cell 20 is disposed near two opposite lateral surfaces 16 parallel to the strips. Similarly, when the micro-structure 18 is formed on the first surface 12, the solar cells 20 can be disposed near two opposite lateral surfaces 16 parallel to the strips.

Figure 3A:
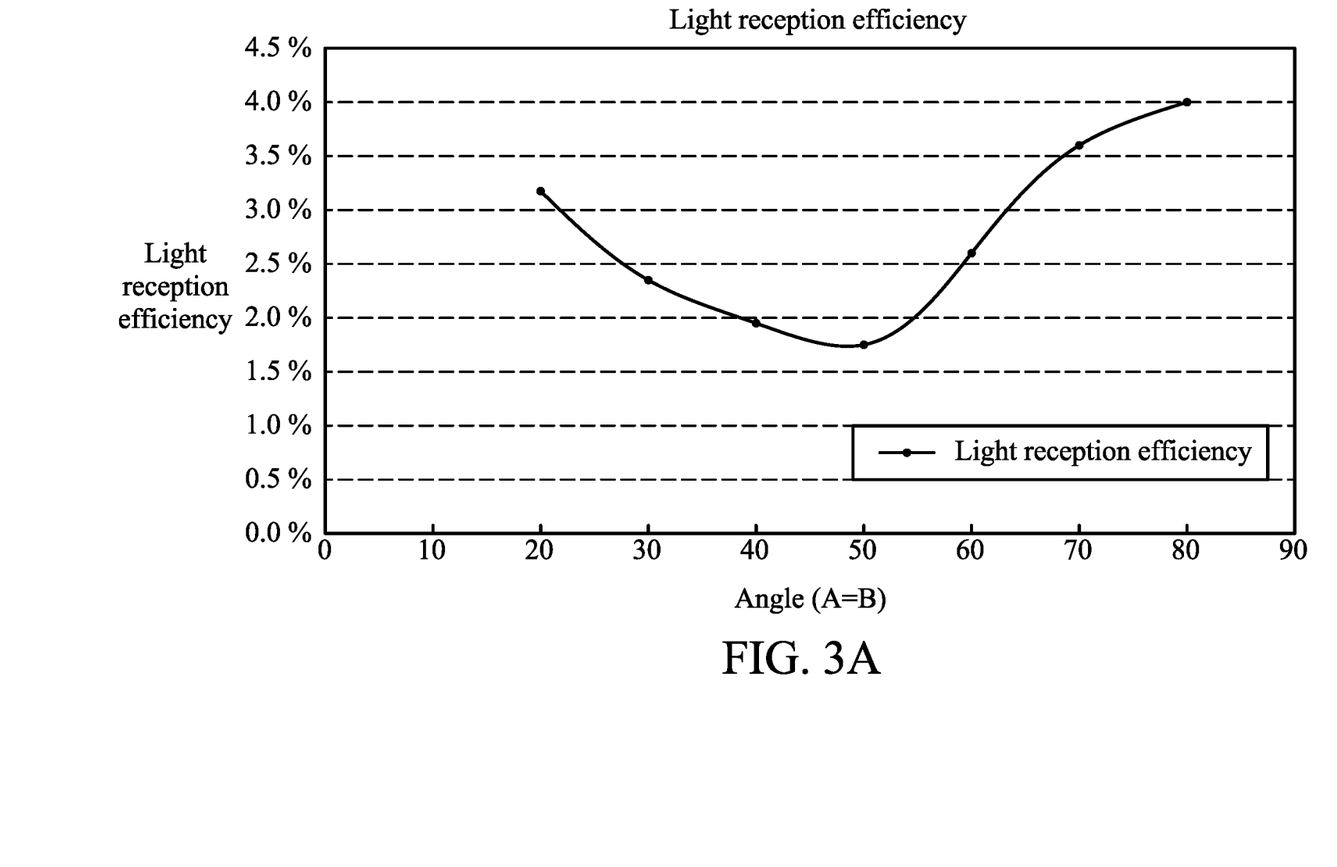
FIG. 3A depicts the solar energy collecting efficiency of the solar cell versus a variety of the angles A and B when the angle A is equal to angle B.
Figure 3B:
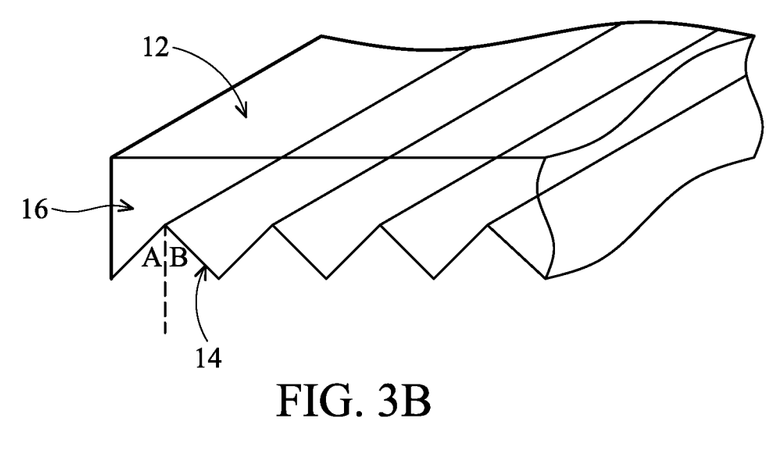
FIG. 3B is an enlarged view of the substrate of FIG. 2.

FIG. 3A depicts the solar energy collecting efficiency. The cross section of the strip of the micro-structure 18 is triangular. The vertex angle of the triangular is divided into two angles A and B by a vertical line extending from an apex. In FIG. 3A, the solar energy collecting efficiency is measured when angle A is equal to angle B. The solar energy collecting efficiency is defined as the ratio of the solar light reflected by the micro-structure 18 over the solar light entering the substrate 10. In this embodiment, the size of the substrate 10 is 240×180×3 mm. The size of the solar cell is 240×3 mm. The height of the strip is 25 μm. FIG. 3A shows the good efficiency when angle A and B are 80°. FIG. 3B is an enlarged view of the substrate of FIG. 2.

Figure 4:
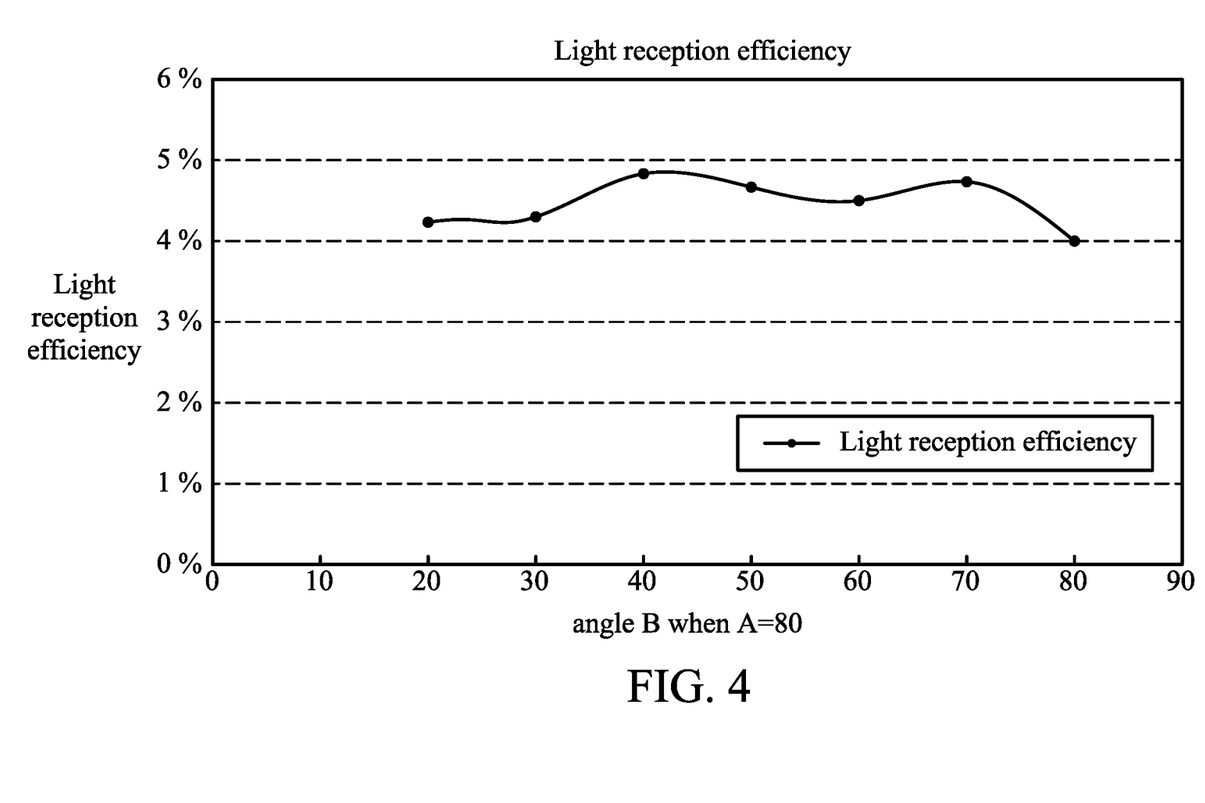
FIG. 4 depicts the solar energy collecting efficiency of the solar cell versus a variety of angle B when the angle A=80°.

FIG. 4 shows the solar energy collecting efficiency of the solar cell versus a variety of angle B when the angle A=80°. The good efficiency occurs when the angle B is 40° or 70°.

In addition, the micro-structure is not limited to the striped structure. It can be a protrusion of a pyramid. In such a structure, the solar light can be reflected to four lateral surfaces 16 uniformly. The solar cells 20 can be disposed near four lateral surfaces 16.

The micro-structure 18 can also be formed on the first surface 12. When solar light reaches the first surface 12, it has a large refraction angle caused by the micro structure 18. When the refracted solar light reaches the second surface 14, total reflection occurs, which increases the solar energy collecting efficiency. When the micro-structure is formed on the first surface 12, the micro/nano structure with anti-reflective or water repellent function is not needed. The water repellent material can be coated on the first surface 12 for preventing attachment of rain drops.

Figure 6:
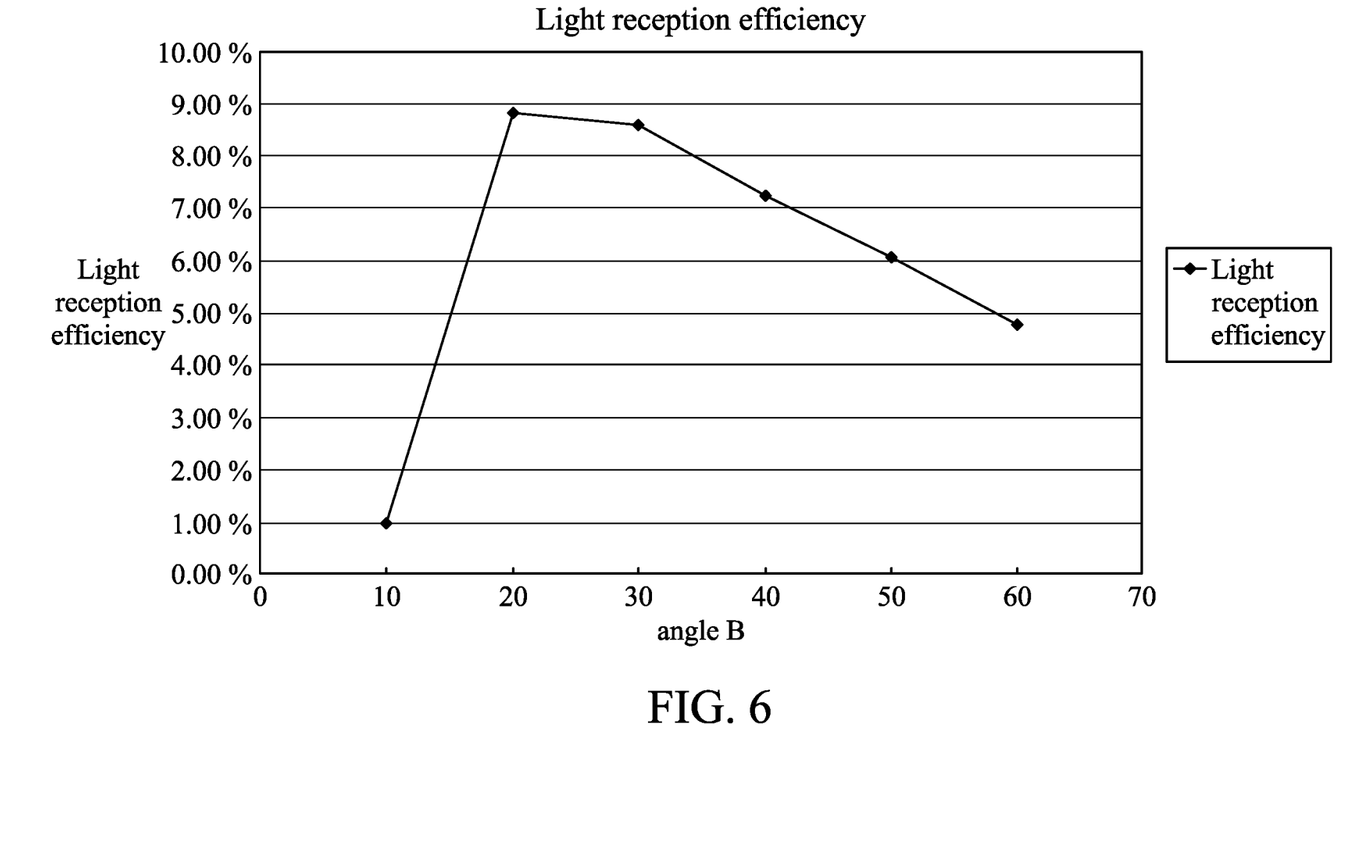
FIG. 6 depicts the solar energy collecting efficiency of the solar cell versus a variety of angle Bs when the angle A=80° and the micro-structure is formed on the first surface.

The micro-structure formed on the first surface 12 can be the strips shown in FIG. 2. FIG. 6 depicts the solar energy collecting efficiency versus a variety of angle B when the micro-structure is formed on the first surface 12 and the angle A=80°. In this embodiment, the size of the substrate 10 is 240×180×3 mm. The size of the solar cell is 240×3 mm. The height of the strip is 25 μm. FIG. 6 shows that when angle B is 20° or 30°, a good efficiency is obtained.

The solar light entering the substrate 10 is considered as 100%. If no collection is executed (a solar cell with an area equal to the substrate), the solar energy collecting efficiency per unit area is 100÷(240×180). In the embodiment of FIG. 6, when angle B=20°, the solar energy collecting efficiency is 8.81 (240×3). The solar energy collecting efficiency of the invention is 5.28 times that as a no collection case. It indicates that the solar energy collecting module of the invention can conduct solar light into the solar cell near the lateral surface efficiently.

Although the micro-structure is formed on the first surface 12 in FIG. 6, in this structure, no micro-structure is formed on the second surface 14. The micro-structure can be formed on both the first and second surfaces 12 and 14. When the solar light penetrates the first surface 12 and reaches the second surface 14, it is reflected or refracted by the micro-structures on the first surface 12 and the second surface 14 to the lateral surface 16 and is absorbed by the solar cell 20.

As long as the solar light can be reflected or refracted efficiently, the shape of the micro-structure is not limited. For example, pyramid or cylinder shape protrusions can be formed on the second surface 14. The positions of the solar cell can correspond to the shape of the micro-structure. For example, in the embodiment, as the micro-structure comprises strips, solar light can be conducted into the lateral surfaces parallel to the strips. The solar cell can be disposed near the two lateral surfaces. If the micro-structure comprises cylinder protrusions, the collecting efficiency is substantially identical in all directions. The solar cells can be disposed near the four lateral surfaces for such a structure.

Figure 5A:
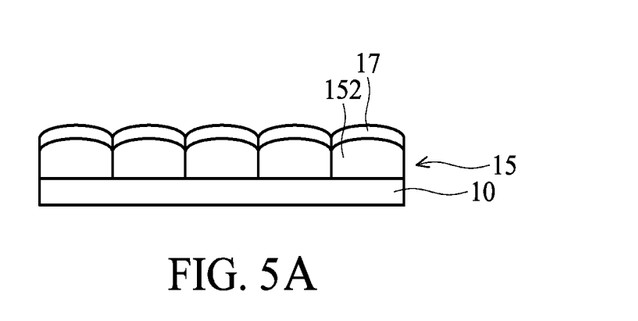
FIG. 5A is a schematic view of the micro/nano structure formed on the first surface of the substrate.

A micro/nano scale structure 13 with anti-reflective or water repellent function is formed by a single-layer structure shown in FIG. 5A. A micro/nano layer 15 is formed on the substrate 10. A metal layer 17 is formed on the micro/nano layer 15. The micro/nano layer 15 comprises a three dimensional structure 152 with a cross section having a width gradually large from a top to bottom portion. The period of the three dimensional structure 152 is 100~600 nm (the period indicates the distance of the top of one of the three dimensional structures 152 to the top of the next three dimensional structure), and the height is 100~750 nm. The material of the metal layer 17 can be gold, silver, aluminum, nickel, copper, chromium, tin oxide or indium tin oxide (ITO). The thickness is less than 150 nm.

Figure 5B:
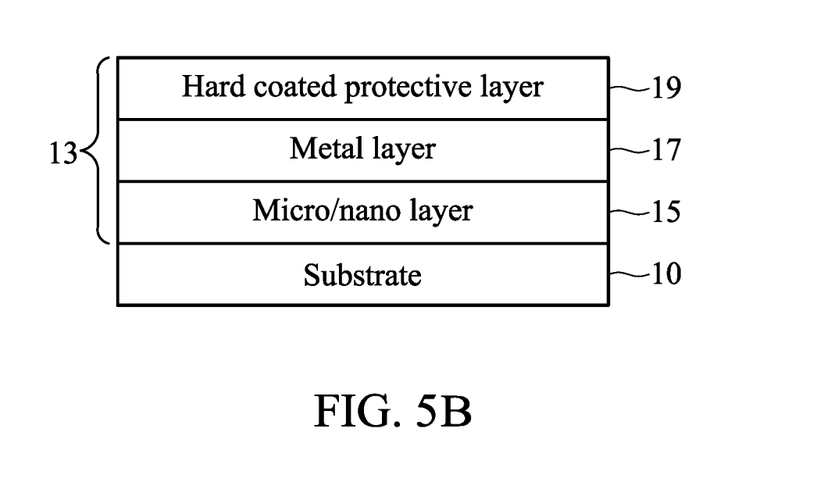
FIG. 5B is a block diagram of the micro/nano structure further including a hard coated protective layer.

The micro/nano layer 15 can be formed by the following method. The three dimensional mold is formed on the periphery of a roller by a lithography and etching process. A polymer substrate with high transparent property is provided. UV gel is coated on the surface of the polymer substrate. The polymer substrate is attached to the three dimensional mold and exposed to UV light, which hardens the UV gel. Finally the three dimensional structure 152 is formed. As many gaps exist between the three dimensional structure 152, the rain drops contact a smaller area to reduce adhesive force, which provides the water repellent function. A metal layer 17 is formed on the micro/nano layer 15 to allow the solar light to penetrate and reduce the reflection rate on the inner side, which provides an anti-reflective function. A hard coated protective layer 19 is formed on the metal layer 17, as shown in FIG. 5B.

The single-layer structure of the invention has a wider viewing angle and lower costs when compared with the conventional multiple layer structure. The single-layer structure can be formed by a low temperature process and is suitable for plastic substrates. Additionally, the single-layered structure has no need for a vacant environment area and no need for pre-processing, and has high attachment properties and high anti-dirt properties.

Next, the solar energy collecting system of the invention is compared with a conventional backlight module of a side light type. The conventional backlight module conducts the light from a light source from the lateral side of a lightguide plate to the front surface of the lightguide plate. In addition to the lightguide plate, a reflective film, a diffusion film and a prism film are also needed. In the solar energy collecting system of the invention, light enters the substrate and is reflected by the micro-structure to the solar cell on the later side. The reflective film, the diffusion film and the prism film are not needed.

While the invention has been described by way of example and in terms of the embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A solar energy collecting module, comprising:
   a substrate comprising a first surface, a second surface and a plurality of lateral surfaces, wherein the first surface faces the second surface, the lateral surfaces are adjacent to the first and second surfaces, and a first micro-structure is formed on the second surface;
   at least one solar cell disposed on one of the lateral surfaces, arranged such that solar light penetrates the first surface and is refracted or reflected by the first micro-structure on the second surface to leave the substrate via the lateral surface on which the solar cell is disposed and be absorbed by the solar cell; and
   a micro/nano-scale structure comprising:
      a micro/nano layer formed on the first surface of the substrate; and
      a metal layer formed on the micro/nano layer,
   wherein the first micro-structure comprises a plurality of strips, wherein each of the strips extends in a direction parallel to the lateral surface on which the solar cell is disposed, and a cross section of each strip is triangular,
   wherein a vertex angle of the triangular of each of the strips is divided into an angle A and an angle B by a vertical line extending from an apex, the angle A is 80 degrees, and the angle B is 40-80 degrees.

2. The solar energy collecting module as claimed in claim 1, wherein the substrate is made of a transparent material.

3. The solar energy collecting module as claimed in claim 1, wherein the solar cell is made of silicon or a semiconductor material selected from the chemical elements listed on Group III and Group V of the periodic table.

4. The solar energy collecting module as claimed in claim 1, wherein a distance between the solar cell and the lateral surface is less than 1 mm.

5. The solar energy collecting module as claimed in claim 1, wherein the first surface is coated by a water repellent material comprising polyvinylidene fluoride, polysulfone, reactive modifying agent with a water-free polymer, silicon rubber, Acrylonitrile-Butadien-Styrene, or Polytetrafluoroethylene (PTFE).

6. The solar energy collecting module as claimed in claim 1, wherein the micro/nano-scale structure comprises a plurality of three-dimensional structures, and each of the three-dimensional structures is with a cross section having a width that is gradually larger from a top to a bottom portion and a height of 100-570 nm, arranged with a period of 100-600 nm.

7. The solar energy collecting module as claimed in claim 1, wherein the metal layer comprises gold, silver, aluminum, nickel, copper, chromium, tin oxide or indium tin oxide (ITO).

8. The solar energy collecting module as claimed in claim 1, wherein a thickness of the metal layer is less than 150 nm.

9. The solar energy collecting module as claimed in claim 1, wherein the micro/nano structure further comprises a hard coating coated on the metal layer.

* * * * *